US006778003B1

(12) United States Patent
Callaway et al.

(10) Patent No.: US 6,778,003 B1
(45) Date of Patent: Aug. 17, 2004

(54) METHOD AND CIRCUIT FOR ADJUSTING A VOLTAGE UPON DETECTION OF A COMMAND APPLIED TO AN INTEGRATED CIRCUIT

(75) Inventors: Brian Callaway, Boise, ID (US); Mike Shore, Boise, ID (US); Hal Butler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/428,040

(22) Filed: Apr. 30, 2003

(51) Int. Cl.⁷ ................................................. G05F 1/10
(52) U.S. Cl. .................................................... 327/536
(58) Field of Search .............................. 327/530, 534, 327/535, 536, 537

(56) References Cited

U.S. PATENT DOCUMENTS

| | | | |
|---|---|---|---|
| 5,038,325 A | 8/1991 | Douglas et al. | 365/189.06 |
| 5,260,646 A | 11/1993 | Ong | 323/349 |
| 5,537,306 A | 7/1996 | Blodgett | 363/60 |
| 5,552,739 A | 9/1996 | Keeth et al. | 327/538 |
| 5,629,843 A | 5/1997 | Loughmiller et al. | 363/60 |
| 5,740,111 A | 4/1998 | Duesman | 365/189.09 |
| 5,811,990 A | 9/1998 | Blodgett et al. | 326/81 |
| 6,160,723 A | 12/2000 | Liu | 363/60 |
| 6,384,669 B2 | 5/2002 | Mecier et al. | 327/536 |
| 6,411,157 B1 * | 6/2002 | Hsu et al. | 327/536 |
| 6,504,421 B2 | 1/2003 | Blodgett et al. | 327/536 |
| 6,532,177 B1 | 3/2003 | Butler | 365/189.09 |
| 6,597,235 B2 * | 7/2003 | Choi | 327/536 |
| 6,646,494 B2 * | 11/2003 | Dohi et al. | 327/536 |

* cited by examiner

Primary Examiner—Jeffrey Zweizig
(74) Attorney, Agent, or Firm—Dorsey & Whitney LLP

(57) ABSTRACT

A voltage generation circuit includes a voltage pump that receives a supply voltage and develops an output voltage responsive to a pump activation signal. A level detection circuit receives a pump-boost signal and is coupled to the voltage pump to receive the output voltage. The level detection circuit operates in a normal mode responsive to the pump-boost signal being inactive to develop the pump activation signal to activate the voltage pump responsive to the output voltage being less than or equal to a first low threshold value. The level detection circuit operates in a demand-controlled mode responsive to the pump-boost signal being active to develop the pump activation signal to activate the voltage pump responsive to the output voltage being less than or equal to a second low threshold value.

27 Claims, 4 Drawing Sheets

*(Background)*

METHOD AND CIRCUIT FOR ADJUSTING A VOLTAGE UPON DETECTION OF A COMMAND APPLIED TO AN INTEGRATED CIRCUIT

TECHNICAL FIELD

The present invention relates generally to integrated circuits, and more specifically to the generation of voltages in integrated circuits.

BACKGROUND OF THE INVENTION

A supply voltage VCC is applied to a typical integrated circuit, and within the integrated circuit a variety of different voltages arc derived from this supply voltage and utilized during operation. For example, in a typical memory device, such as a dynamic random access memory (DRAM), a voltage pump generates a negative back bias voltage that is applied to the bodies of MOS transistors forming the DRAM. A typical DRAM also includes a voltage pump for generating a pumped supply voltage VCCP having a magnitude greater than a magnitude of the supply voltage VCC, with the pumped supply voltage being applied to word lines to access data stored in rows of memory cells.

A typical DRAM includes a number of memory cells arrays, each array including a plurality of memory cells arrays arranged in rows and columns. Each memory cell stores a bit of data in the form of an electric charge stored on a capacitor, and each memory cell in a given row is coupled to a corresponding word line. In a DRAM, the data stored in the memory cells must periodically be "refreshed" since the charge stored on each capacitor, which represents the stored data, leaks over time. Accordingly, DRAMs perform what are known as refresh cycles during which all rows of memory cells are accessed to recharge the respective charges stored on the capacitors and thereby refresh the stored data. To access the data stored in a row of memory cells, the pumped supply voltage is applied to the corresponding word line. A refresh cycle is initiated in response to a refresh command applied to the DRAM, or is initiated automatically within the DRAM when the DRAM operates in an auto-refresh mode after an auto-refresh command is applied to the DRAM, as will be understood by those skilled in the art.

During a refresh cycle, data stored in DRAM cannot be accessed and thus it is desirable to reduce the time of a refresh cycle. To minimize the duration of a refresh cycle, DRAMs utilize row compression, meaning that multiple rows of memory cells in multiple arrays are simultaneously accessed to simultaneously refresh the associated data This reduces the duration of the refresh cycle by reducing the time required to access every row in each array in the DRAM. Accessing multiple rows of memory cells simultaneously, however, increases the current drawn from the voltage pump generating the pumped supply voltage VCCP because multiple word lines must now be charged in parallel to the required voltage levels. As a result, the voltage pump generating VCCP must maintain the voltage VCCP at a minimum value VMIN to ensure that if an auto-refresh command is received the voltage VCCP does not drop below a lower threshold voltage VLT. The voltage VCCP cannot be allowed to drop below the lower threshold voltage VLT and proper operation of the DRAM ensured, as will be appreciate by those skilled in the art.

FIG. 1 is a signal diagram illustrating the voltage VCCP generated by a conventional voltage pump as a function of time. A maximum value VMAX and the minimum value VMIN define the hysteresis of the voltage pump. From a time T0 to a time T1 the pump activated, and operates to charge the voltage VCCP until it reaches VMAX, at which point the pump is deactivated and the voltage VCCP decays. When the voltage VCCP reachs VMIN, the pump is once again activated an begins charging VCCP once again. The value VMIN must be maintained above the lower threshold value VLT in the event that an auto-refresh command is received when the voltage VCCP is at VMIN, as previously mentioned. For example, if a received auto-refresh command results in increased demand from the voltage pump at a time T2 when the voltage VCCP is at VMIN. As used herein, increased demand of the voltage pump means increased current drawn from the pump or increased power consumption from the pump, and may simply be referred to as demand on the supply voltage VCCP instead demand on the pump generating that supply voltage. A dotted line 100 indicates the voltage VCCP just after the time T2 if demand increases at T2 due to an auto-refresh command. Because VMIN is greater than VLT, VCCP never drops below VLT as required, even when increased demand occurs at a time T2 when VCCP=VMIN. Note that if demand increases at any time other than T2, then VCCP does not equal VMIN so there is no concern that VCCP will drop below VLT.

While conventional voltage pumps that operate as illustrated in FIG. 1 ensure proper operation of the DRAM, such pumps consume a relatively large amount of power since they must operate to maintain VCCP between VMAX and VMIN just in case demand increases responsive to an auto-refresh command when VCCP=VMIN. This may limit the use of the DRAM in low power applications, such as in portable batter-powered devices. The relatively large value VMAX also stresses components in the DRAM and thus can reduce the life of such components, as will be appreciated by one skilled in the art. Moreover, although the above discussion deals with the pumped voltage VCCP, the same principles and concepts apply to the previously mentioned back-bias voltage, and to any other voltage sources that may experience increased demand in response to a command applied to the DRAM or other type of integrated circuit.

There is a need for a method and system of lowering the power consumption and improving the operation of voltage generators contained in integrated circuits.

SUMMARY OF THE INVENTION

According to one aspect of the present invention, a voltage generation circuit includes a voltage pump that receives a supply voltage and develops an output voltage responsive to a pump activation signal. A level detection circuit receives a pump-boost signal and is coupled to the voltage pump to receive the output voltage. The level detection circuit operates in a normal mode responsive to the pump-boost signal being inactive to develop the pump activation signal to activate the voltage pump responsive to the output voltage being less than or equal to a first low threshold value. The level detection circuit operates in a demand-controlled mode responsive to the pump-boost signal being active to develop the pump activation signal to activate the voltage pump responsive to the output voltage being less than or equal to a second low threshold value.

DETAILED DESCRIPTION OF THE INVENTION

Figure 2:
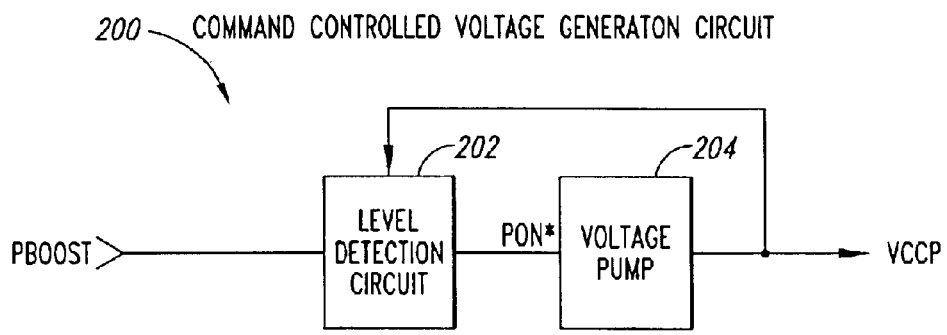
FIG. 2 is a functional block diagram of a command-controlled voltage generation circuit according to one embodiment of the present invention.

FIG. 2 is a functional block diagram of a command-controlled voltage generation circuit 200 which receives a pump boost signal PBOOST indicating an upcoming increase in demand of a pumped supply voltage VCCP, and which adjusts generation of the pumped supply voltage in advance of an actual increase in demand according to one embodiment of the present invention. The command-controlled voltage generation circuit 200 anticipates an increase in demand of the voltage VCCP that will occur in response to an auto-refresh or other command applied to an integrated circuit containing the voltage generation circuit. By anticipating an increase in demand, minimum and maximum values VMAX, VMIN of the voltage VCCP can be reduced while still ensuring VCCP never drops below a minimum threshold value VLT, as will be explained in more detail below. Reducing the minimum and maximum values VMAX, VMIN of the voltage VCCP lowers the power consumption of the voltage generation circuit 200, and the lower value VMAX reduces the stress of components in an integrated circuit containing the voltage generation circuit.

The command-controlled voltage generation circuit 200 includes a level detection circuit 202 that receives the PBOOST signal and the pumped supply voltage VCCP from a voltage pump 204. The level detection circuit 202 generates a pump activation signal PON* responsive to the magnitude of the supply voltage VCCP, and operates in two modes, a normal mode and a demand-controlled mode, responsive to the PBOOST signal. When the PBOOST signal is inactive, the level detection circuit 202 operates in the normal mode, and activates the PON* signal when the pumped supply voltage VCCP is less than or equal to a first low threshold value VLT1. The first low threshold value VLT1 corresponds to the value below which the supply voltage VCCP cannot be allowed to drop to ensure proper operation of the integrated circuit (not shown) containing the voltage generation circuit 200. For example, if the pumped supply voltage VCCP drops below VLT1 an insufficient charge may be stored in capacitors in memory cells in the DRAM to ensure reliable storage of such data. Once the magnitude of the supply voltage VCCP reaches a maximum threshold value VMAX, the level detection circuit 202 deactivates the PON* signal. The level detection circuit 202 operates in the demand-controlled mode when the PBOOST signal is active, and in this mode activates the PON* signal when the pumped supply voltage VCCP is less than or equal to a second low threshold value VLT2, where VLT2>VLT1. Once again, during the demand-controlled mode the level detection circuit 202 deactivates the PON* signal when the supply voltage VCCP reaches the maximum threshold value VMAX.

The voltage pump 204 turns ON and supplies charge to increase the magnitude of the voltage VCCP when the PON* signal is active. Conversely, when the PON* signal is inactive the voltage pump 204 turns OFF and the magnitude of the voltage VCCP gradually decreases or decays. One skilled in the art will understand suitable circuitry for forming the voltage pump 204, and thus, for the sake of brevity, such detailed circuitry will not be described in more detail.

Figure 3:
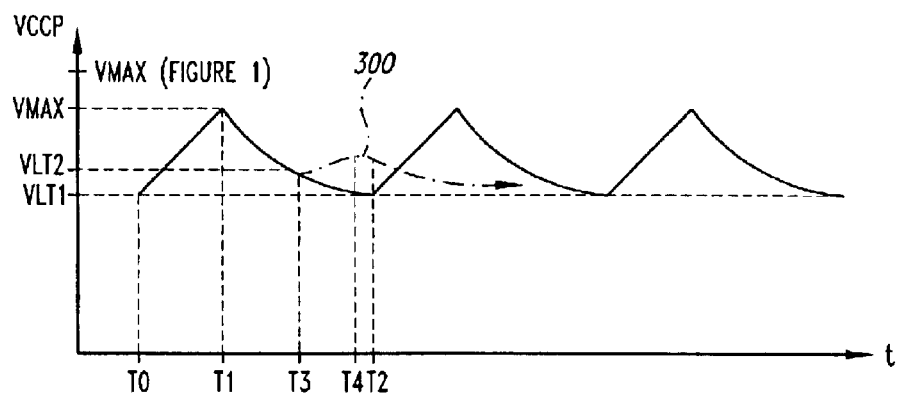
FIG. 3 is a signal diagram illustrating the operation of the command-controlled voltage generation circuit of FIG. 2.

The operation of the command-controlled voltage generation circuit 200 will now be described in more detail with reference to the signal timing diagram of FIG. 3. When the PBOOST signal is inactive, the voltage generation circuit 200 operates in the normal mode of operation. During the normal mode, the level detection circuit 202 detects the magnitude of the supply voltage VCCP and alternately activates and deactivates the PON* signal to maintain the supply voltage within a maximum threshold value VMAX and the low threshold VLT1. The solid line in FIG. 3 illustrates the variation of the pumped supply voltage VCCP between the threshold values VMAX and VLT1 during the normal mode. The range defined by the threshold values VMAX and VLT1 defines the hysteresis of the voltage pump 204, as previously discussed. FIG. 3. shows that a time T0, the pumped supply voltage VCCP equals the low threshold value VLT1, causing the level detection circuit 202 to activate the PON* signal and the voltage pump 204 to turn ON and begin charging the pumped supply voltage VCCP. Once the pumped supply voltage VCCP reaches the maximum threshold value VMAX, the voltage pump 204 turns OFF and the pumped supply voltage VCCP decays until a time T2. At the time T2, the pumped supply voltage VCCP once again reaches the low threshold value VLT1, causing the level detection circuit 202 to activate the PON* signal and thereby causing pump 204 to turn ON and begin charging the supply voltage VCCP. The level detection circuit 202 and voltage pump 204 continue operating in this manner to maintain the pumped supply voltage VCCP between the threshold values VMAX and VLT1.

When a memory device or other integrated circuit containing the command-controlled voltage generation circuit 200 receives a command that will increase the demand on the pumped supply voltage VCCP, such as an auto-refresh command, the PBOOST signal is activated in response to this command. The command-controlled voltage generation circuit 200 commences operation in the demand-controlled mode responsive to the active PBOOST signal. In the following description, an auto-refresh command is assumed to be the command applied to the memory device and which will increase demand of the supply voltage VCCP, although, as previously mentioned, the PBOOST signal could be activated responsive to other commands being applied to the memory device. Moreover, both the auto-refresh command and other commands could result in the PBOOST signal being activated.

During the demand-controlled mode, the level detection circuit 202 operates in the same way as in the normal mode, except that the level detection circuit detects adjusts hysteresis of the voltage pump 204 so that pumped supply voltage VCCP varies between the maximum threshold value VMAX and the low threshold value VLT2, where VLT2>VLT1. Thus, the level detection circuit 202 detects the magnitude of the supply voltage VCCP and alternately activates and deactivates the PON* signal to maintain the supply voltage within a maximum threshold value VMAX and the low threshold VLT2. Due to the subsequent increased demand on the supply voltage VCCP resulting from the auto-refresh command, the supply voltage VCCP does not typically cycle between the threshold values VMAX and VLT2 as during the normal mode. Instead, the increased demand results in the supply voltage VCCP never reaching the maximum threshold value VMAX and thus the voltage pump 204 runs continuously during this mode, as will be discussed in more detail below.

In FIG. 3, the voltage generation circuit 200 enters the demand-controlled mode at a time T3. Thus, at the time T3 the PBOOST signal is activated. Depending on the magnitude of the supply voltage VCCP at this point in time, the level detection circuit 202 may activate the PON* signal at this moment or may maintain this signal inactive. If the supply voltage VCCP is less than the threshold VLT2, the level detection circuit 202 will activate the PON* signal, while if the supply voltage is greater than VLT2 the level detection circuit will not activate PON*. In the example of FIG. 3, at time T3 the supply voltage VCCP is less than the threshold value VLT2, meaning the level detection circuit 202 activates the PON* signal to thereby turn ON the voltage pump 204.

The dotted line in FIG. 3 starting at the time T3 illustrates the magnitude of the supply voltage VCCP during the demand-controlled mode. Because at time T3 VCCP<VLT2, the level detection circuit 202 activates the PON* signal, turning ON the voltage pump 204 to begin charging the supply voltage VCCP, as shown by the dotted line. At this point in time, circuitry (not shown) in the memory device is being activated in anticipation of an auto-refresh cycle that will be executed in response to the applied auto-refresh command. Thus, the supply voltage VCCP continues increasing since the pump 204 is activated but no increased demand has yet been placed on the supply voltage VCCP.

At a time T4, the auto-refresh cycle commences and demand on the supply voltage VCCP increases significantly. As a result, the magnitude of the supply voltage VCCP begins decreasing at just after the time T4, and continues decreasing until it reaches some minimum value that is greater than the low threshold value VLT1. Recall, the first threshold value VLT1 is the value below which the supply voltage VCCP cannot be allowed to drop. The supply voltage VCCP typically remains at approximately this minimum value for the remainder of the auto-refresh cycle due to the high demand placed on the supply voltage during the auto-refresh mode.

Figure 1:
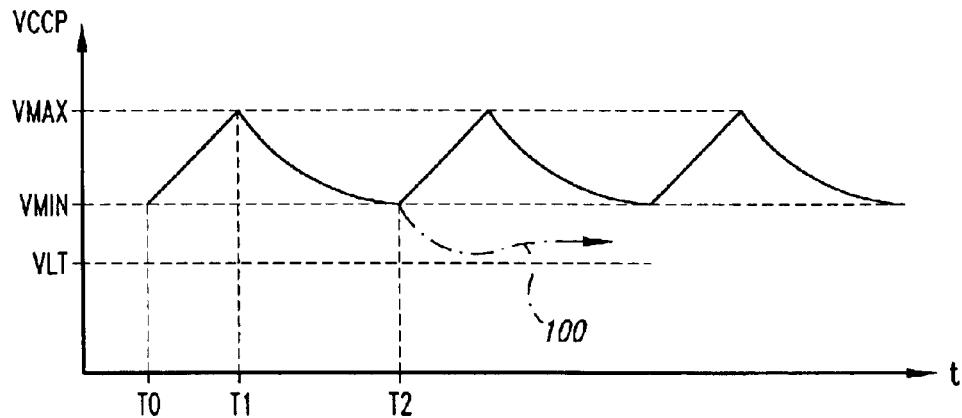
FIG. 1 is a signal timing diagram illustrating the operation of a conventional voltage pump for generating a pumped supply voltage.

By anticipating a large demand that will be placed on the supply voltage VCCP during an auto-refresh cycle, the command-controlled voltage generation circuit 200 consumes less power than a conventional voltage generation circuit. This is true because with the circuit 200, the maximum threshold value VMAX may be lower than that of the conventional voltage pump described with reference to FIG. 1 and because the supply voltage VCCP may be allowed to drop to the first minimum threshold value VLT1 without concern for increased demand due to an auto-refresh command. Where the circuit 200 has the same hysteresis as a corresponding conventional voltage pump described with reference to FIG. 1, the maximum threhold value VMAX may be reduced by an amount given by the difference VMIN-VLT in FIG. 1. This may be viewed as shifting the waveform of the conventional voltage pump downward so that VMIN=VLT. This could not be done with the conventional voltage pump, however, because if increased demand was the applied to the voltage pump when VCCP=VLT, the supply voltage would drop below VLT. The command-controlled voltage generation circuit 200 prevents this from ever happening by beginning charging of the supply voltage VCCP prior to such demand actually occurring. The lower magnitudes of the thresholds defining the hysteresis of the circuit 200, namely VMAX and VLT2, lowers the power consumption of the circuit.

By lowering the maximum threshold value VMAX of the supply voltage VCCP, the command-controlled voltage generation circuit 200 also places less stress on components to which the supply voltage is applied and thereby increases the operable life of such components. As will be understood by those skilled in the art, high voltages applied to electrical components can cause damage and thereby reduce the life of such components For example, a relatively high voltage applied across a P-N junction result in a breakdown which damages or degrades the junction, lowering the life of the component including the P-N junction. The lower magnitude of VMAX places less stress on components in the memory device or other integrated circuit containing the circuit 200 and increases the life of such components.

Figure 4:
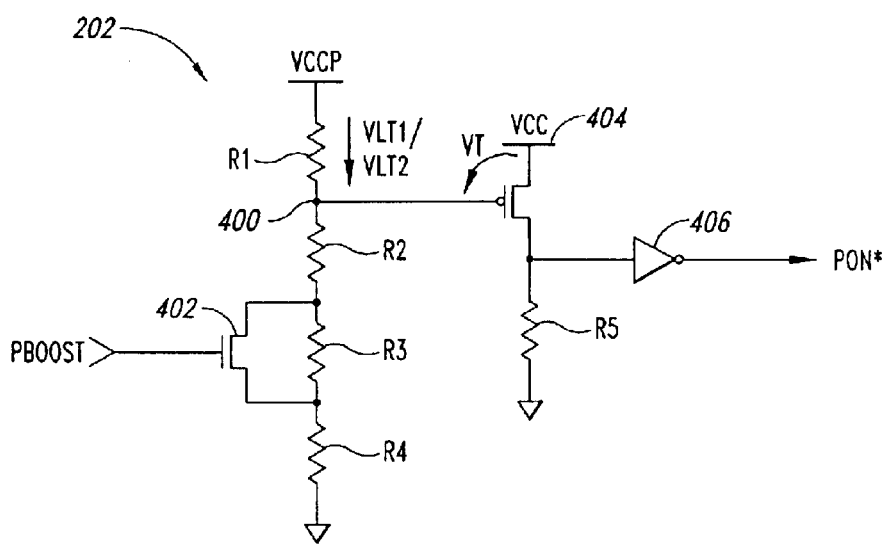
FIG. 4 is a schematic illustrating one embodiment of the level detection circuit of FIG. 2.

FIG. 4 is a schematic illustrating one embodiment of the level detection circuit 202 of FIG. 2. A plurality of resistors R1–R4 are coupled in series between the pumped supply voltage VCCP and ground, with a voltage on a node 400 developed across the resistors R2–R4 determining whether the circuit 202 activates or deactivates the PON* signal. An NMOS transistor 402 is coupled across the resistor R3, and is controlled responsive to the PBOOST signal to remove or include the resistor R3 in the series-connected group of resistors R2–R4 and thereby adjust the voltage on node 400. A PMOS transistor 404 and resistor R5 are coupled in series between a supply voltage VCC and ground, with the voltage on node 400 being applied to the transistor to control the voltage developed across the resistor. An inverter 406 develops the PON* signal responsive to the voltage across the resistor R5. The voltage across the resistor R1 when the voltage on node 400 equals VCC-VT corresponds to the threshold voltage VLT1 or VLT2 of FIG. 3, depending on the mode of operation, as will be described in more detail below.

In operation, when the PBOOST signal is inactive low, the circuit 202 operates in the normal mode. In response to the low PBOOST signal, the transistor 402 turns OFF and the resistor R3 is included in the series-connected group R2–R4 that develops the voltage on node 400. When the voltage on node 400 is less than VCC-VT, where VT is a threshold voltage VT of the PMOS transistor 404, the transistor 404 turns ON and a high voltage develops across resistor R5. In response to the voltage across resistor R5, the inverter 406 drives the PON* signal active low. As VCCP increases, the voltage on node 400 increases, eventually turning OFF transistor 404 when the voltage on node 400 is greater than VCC-VT. When the transistor 404 turns OFF, the voltage across the resistor R5 goes to approximately zero since substantially no current flows through the resistor. In response to this low voltage across the resistor R5, the inverter drives the PON* signal inactive high. As VCCP decreases due to PON* going inactive high and thereby turning OFF voltage pump 204 (FIG. 2), the voltage on node 400 will once again become less than VCC-VT, at which point PON* will again be activated.

When the PBOOST signal is active high, the circuit 202 operates in the auto-refresh mode. In response to the high PBOOST signal, the transistor 402 turns ON and the resistor R3 is removed from the series-connected group R2–R4 that develop the voltage on node 400, causing the resistors R2 and R4 only to develop the voltage on node 400. The circuit 202 thereafter operates as previously described for the normal mode. The voltage on node 400 at which point the circuit 202 activates the PON* signal is different in each mode, which corresponds to different threshold voltages VLT1, VLT2 across the resistor R1. In the auto-refresh mode, the voltage across R1 when the voltage on node 400 equals VCC-VT corresponds to the threshold voltage VLT2, and this voltage is greater than the threshold voltage VLT1 across resistor R1 during the normal mode. This is true because in the auto-refresh mode there is no voltage drop across the resistor R3, while in the normal mode there is a non-zero voltage across the resistor R3, and this voltage across R3 reduces the voltage across R1 since the sum of the drops of all series-connected resistors equals VCCP. Other circuitry for forming the circuit 202 will be understood by those skilled in the art.

Figure 5:
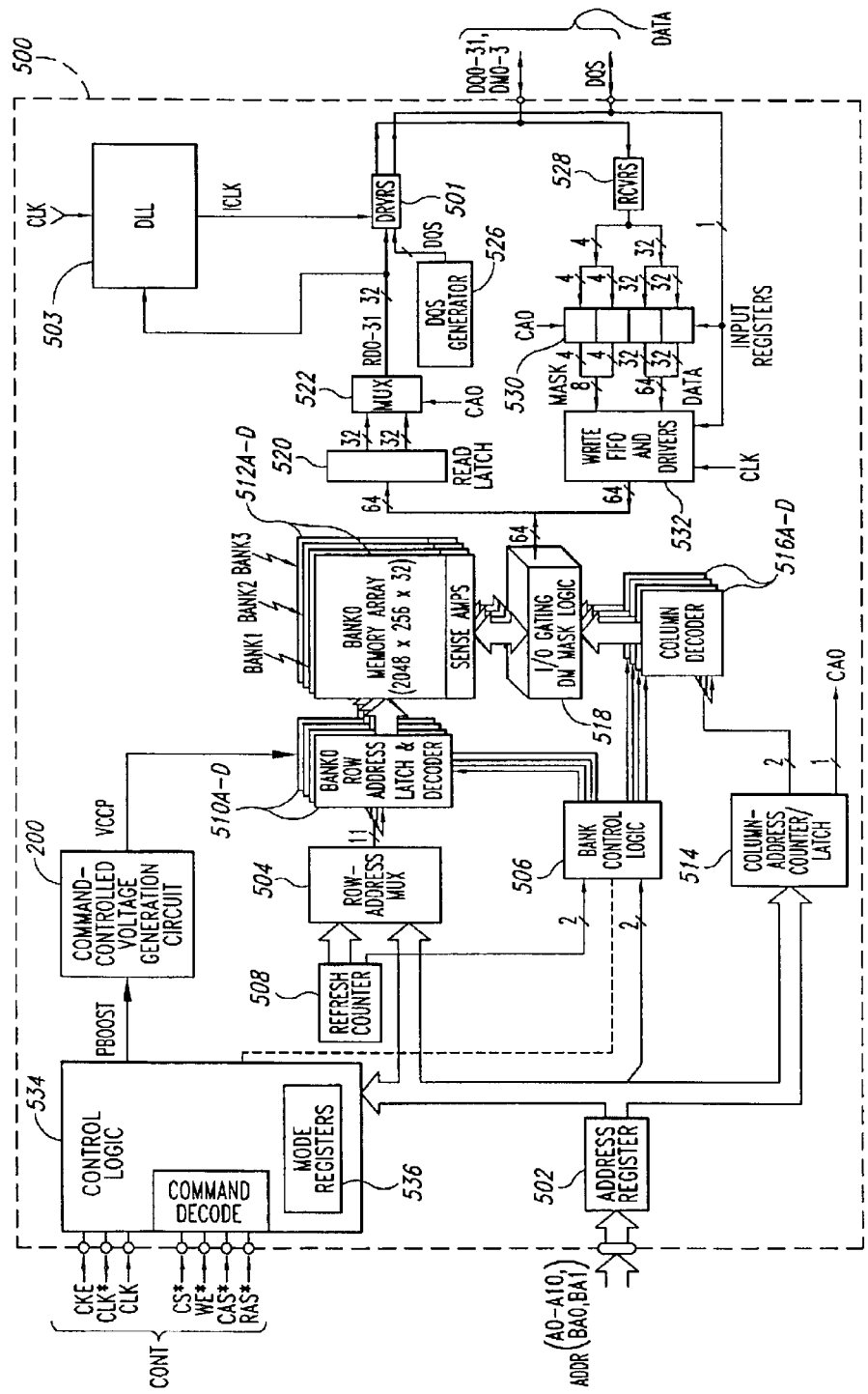
FIG. 5 is a functional block diagram illustrating a memory device including the command-controlled voltage generation circuit of FIG. 2.

FIG. 5 is a functional block diagram of a memory device 500 including the command-controlled voltage generation circuit 200 of FIG. 2 for controlling the pumped supply voltage VCCP that is applied to row address latch and decoders 510A–D which, in turn, utilize the pumped supply voltage to access memory cells in memory banks 512A–D. The pumped supply voltage VCCP may be applied to other components in the memory device as well. The memory device 500 is a double-data rate (DDR) synchronous dynamic random access memory "SDRAM"), although the principles described herein are applicable to any memory device or other integrated circuit that utilizes a voltage pump and receives commands that result in a demand being placed on that voltage pump. Other types of memory devices that could take advantage of the circuit 202 include conventional synchronous DRAMs (SDRAMs), as well as packetized memory devices like SLDRAMs and RDRAMs.

The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A–D. The refresh counter 508 generates the row and bank addresses during the auto-refresh mode of operation. The bank control logic 506 activates the row address latch and decoder 510A–D corresponding to either the bank address received from the address register 502 or a refresh bank address from the refresh counter 508, and the activated row address latch and decoder latches and decodes the received row address. In response to the decoded row address, the activated row address latch and decoder 510A–D applies various signals to a corresponding memory bank 512A–D to thereby activate a row of memory cells corresponding to the decoded row address.

The row address latch and decoders 510A–D utilize the pumped supply voltage VCCP from the voltage generation circuit 200 to access memory cells in the memory banks 512A–D. Each memory bank 512A–D includes a memory-cell array having a plurality of memory cells arranged in rows and columns, and the data stored in the memory cells in the activated row is stored in sense amplifiers in the corresponding memory bank. The row address multiplexer 504 applies the refresh row address from the refresh counter 508 to the decoders 510A–D and the bank control logic circuit 506 uses the refresh bank address from the refresh counter when the memory device 500 operates in the auto-refresh mode responsive to an auto-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A–D. The bank control logic 506 activates the column decoder 516A–D corresponding to the received bank address, and the activated column decoder decodes the applied column address. Depending on the operating mode of the memory device 500, the column address counter and latch 514 either directly applies the latched column address to the decoders 516A–D, or applies a sequence of column addresses to the decoders starting at the column address provided by the address register 502. In response to the column address from the counter and latch 514, the activated column decoder 516A–D applies decode and control signals to an I/O gating and data masking circuit 518 which, in turn, accesses memory cells corresponding to the decoded column address in the activated row of memory cells in the memory bank 512A–D being accessed.

During data read operations, data being read from the addressed memory cells is coupled through the I/O gating and data masking circuit 518 to a read latch 520. The I/O gating and data masking circuit 518 supplies 2N bits of data to the read latch 520, which then applies two N-bit words to a multiplexer 522. In the embodiment of FIG. 5, the circuit 518 provides 64 bits (N=32) to the read latch 520 which, in turn, provides two 32 bit read data words RD0-31 to the multiplexer 522. Data drivers 501 sequentially receive the RD0-31 words from the multiplexer 522, and also receive a data strobe signal DQS from a strobe signal generator 526 and an internal clock signal ICLK generated by a delay-locked loop (DLL) 503 responsive to a clock signal CLK. The DQS signal is used by an external circuit such as a memory controller (not shown) in latching data from the memory device 500 during read operations. In response to the ICLK and CLKDEL/DCl-DCN signals, the data drivers 501 sequentially output each received RD0-31 word as a corresponding data word DQ0-31, each DQ0-31 word being output in synchronism with a rising or falling edge of the CLK signal that is applied to clock the memory device 500. The data drivers 501 also output the data strobe signal DQS having rising and falling edges in synchronism with rising and falling edges of the CLK signal, respectively. Each data word DQ0-31 and the data strobe signal DQS collectively define the data bus DATA. The DATA bus also includes masking signals DM0-M, which will be described in more detail below with reference to data write operations.

During data write operations, an external circuit such as a memory controller (not shown) applies N bit (N=32 in the example of FIG. 8) data words DQ0-N, the strobe signal DQS, and X (X=4 in the example of FIG. 8) data masking signals DM0-3 on the data bus DATA. A data receiver 528 receives each DQ0-N word and the associated DM0-3 signals, and applies these signals to input registers 530 that are clocked by the DQS signal. In response to a rising edge of the DQS signal, the input registers 530 latch a first DQ0-N word and the associated DM0-3 signals, and in response to a falling edge of the DQS signal the input registers latch a second DQ0-N word and associated DM0-3 signals. The input register 530 provides the two latched DQ0-N words as a 64 bit data word to a write FIFO and driver 532, and applies the two latched DM0-3 words as an 8-bit masking word to the FIFO and driver. The FIFO and driver 532 latches the applied 64-bit data word and 8-bit masking word in response to the DQS signal. The 64-bit data word is clocked out of the write FIFO and driver 532 in response to the CLK signal, and is applied to the I/O gating and masking circuit 518. The I/O gating and masking circuit 518 transfers the 64 bit data word to the addressed memory cells in the accessed bank 512A–D subject to the 8-bit masking word, which may be used to selectively mask bits or groups of bits in the data word (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or load mode register command. In response to the clock signals CLK, CLK*, the command decoder 534 latches and decodes an applied command, and generates a sequence of clocking and control signals that control the components 502–532 to execute the function of the applied command. The clock enable signal CKE enables clocking of the command decoder 534 by the clock signals CLK, CLK*. When an auto-refresh or other appropriate command is applied to the command decoder 534, the command decoder decodes the command generates a sequence of clocking and control signals which includes activating the PBOOST signal applied to the voltage generation circuit 200. The command decoder 534 can activate the PBOOST signal responsive to any command that will result in a demand being placed on an internal voltage pump in the memory device 500. Once skilled in the art will understand suitable circuitry for forming the command decoder 534 and all other components in the memory device 500.

The command decoder 534 latches command and address signals at positive edges of the CLK, CLK* signals (i.e., the crossing point of CLK going high and CLK* going low), while the input registers 530 and data drivers 501 transfer data into and from, respectively, the memory device 500 in response to both edges of the data strobe signal DQS and thus at double the frequency of the clock signals CLK, CIK*. This is true because the DQS signal has the same frequency as the CLK, CLK* signals. The memory device 500 is referred to as a double-data-rate device because the data words DQ being transferred to and from the device are transferred at double the rate of a conventional SDRAM, which transfers data at a rate corresponding to the frequency of the applied clock signal. The control logic and command decoder 534 also includes a mode register 536 that is used to define a specific parameters that define a mode of operation of the memory device 500. This definition includes selection of a burst length, burst type, CAS latency, and an operating mode of the device 500. An external circuit, such as a memory controller or memory tester, applies the command signals CS*, WE*, CAS*, and RAS* corresponding to a load mode register command to load appropriate bits into the mode register 536 to thereby set the various parameters and define the mode of operation of the device 500. The detailed operation of the control logic and command decoder 534 in generating the control and timing signals and the mode register 536 in defining the mode of operation of the memory device 500 are conventional, and thus, for the sake of brevity, will not be described in more detail.

Figure 6:
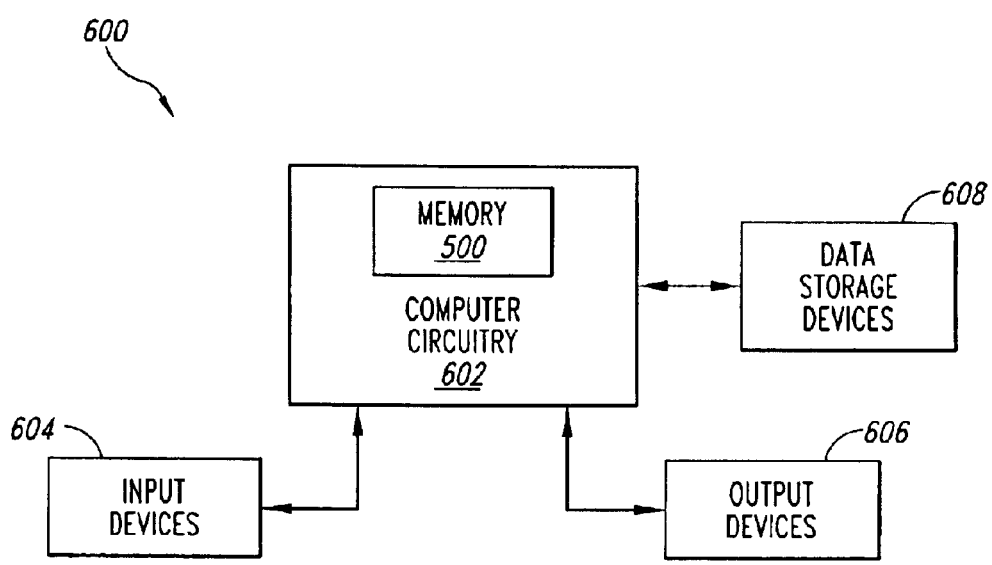
FIG. 6 is a functional block diagram illustrating a computer system including the memory device of FIG. 5.

FIG. 6 is a block diagram of a computer system 600 including computer circuitry 602 that includes the memory device 500 of FIG. 9. Typically, the computer circuitry 602 is coupled through address, data, and control buses to the memory device 500 to provide for writing data to and reading data from the memory device. The computer circuitry 602 includes circuitry for performing various computing functions, such as executing specific software to perform specific calculations or tasks. In addition, the computer system 6600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such as output devices typically including a printer and a video terminal. One or more data storage devices 608 are also typically coupled to the computer circuitry 602 to store data or retrieve data from external storage media (not shown). Examples of typical storage devices 608 include hard and floppy disks, tape cassettes, compact disk read-only (CD-ROMs) and compact disk reads-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, some of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A voltage generation circuit, comprising:
   a voltage pump adapted to receive a supply voltage, the voltage pump operable to develop an output voltage responsive to a pump activation signal;
   a threshold adjustment circuit adapted to receive a pump-boost signal and being coupled to the voltage pump and to a reference voltage supply, the threshold adjustment circuit operable develop an activation voltage on a node responsive to the output voltage from the voltage pump, the activation voltage reaching a trigger value when the output voltage has a first magnitude and the pump-boost signal is active, and the activation voltage reaching the trigger value when the output voltage has a second magnitude and the pump-boost signal is inactive;
   a switching circuit having a first signal terminal adapted to receive a supply voltage and a second signal terminal, and having a control terminal coupled to the node of the threshold adjustment circuit, switching circuit coupling the signal terminals together responsive to the activation voltage on the node;
   a resistor coupled between the second signal terminal the reference voltage supply; and
   an inverter having an input coupled to the second signal terminal and having an output, the inverter developing the pump activation signal on the output responsive to a voltage across the resistor to activate the pump activation signal responsive to the activation voltage being less than the trigger value and operable to deactivate the pump activation signal responsive to the activation voltage being greater than the trigger value.

2. The voltage generation circuit of claim 1 wherein the first magnitude is greater than the second magnitude.

3. The voltage generation circuit of claim 1 wherein the voltage pump comprises a pumped supply voltage pump and wherein the output voltage comprises a pumped supply voltage.

4. The voltage generation circuit of claim 1 wherein the threshold adjustment circuit comprises:
- a plurality of resistors coupled in series between the voltage pump and a reference voltage supply; and
- a switching circuit having signal terminals coupled in parallel with at least one of the resistors and having a control terminal adapted to receive the pump-boost signal, the switching circuit coupling the signal terminals together responsive to the pump-boost signal being active and isolating the signal terminals responsive to the pump-boost signal being inactive.

5. The voltage generation circuit of claim 4 wherein the switching circuit comprises an NMOS transistor.

6. The voltage generation circuit of claim 4 wherein the plurality of resistors comprises a first resistor coupled between the voltage pump and the node, and second, third, and fourth resistors coupled in series between the node and the reference voltage supply.

7. The voltage generation circuit of claim 6 wherein the switching circuit is coupled in parallel with the third resistor.

8. A memory device, comprising:
- an address bus;
- a control bus;
- a data bus;
- an address decoder coupled to the address bus;
- a read/write circuit coupled to the data bus;
- a control circuit coupled to the control bus;
- a memory-cell array coupled to the address decoder, control circuit, and read/write circuit; and
- a voltage generation circuit coupled to at least one of the address decoder and the memory-cell array, the voltage generation circuit comprising:
  - a voltage pump adapted to receive a supply voltage, the voltage pump operable to develop an output voltage responsive to a pump activation signal;
  - a threshold adjustment circuit adapted to receive a pump-boost signal and being coupled to the voltage pump and to a reference voltage supply, the threshold adjustment circuit operable develop an activation voltage on a node responsive to the output voltage from the voltage pump, the activation voltage reaching a trigger value when the output voltage has a first magnitude and the pump-boost signal is active and the activation voltage reaching the trigger value when the output voltage has a second magnitude and the pump-boost signal is inactive;
  - a switching circuit having a first signal terminal adapted to receive a supply voltage and a second signal terminal, and having a control terminal coupled to the node, switching circuit coupling the signal terminals together responsive to the activation voltage on the node;
  - a resistor coupled between the second signal terminal the reference voltage supply; and
  - an inverter having an input coupled to the second signal terminal and having an output, the inverter developing the pump activation signal on the output responsive to a voltage across the resistor.

9. The memory device of claim 8 wherein the memory device comprises a DDR SDRAM.

10. The memory device of claim 8 wherein the first magnitude is greater than the second magnitude.

11. The memory device of claim 8 wherein the voltage pump comprises a pumped supply voltage pump and wherein the output voltage comprises a pumped supply voltage.

12. The memory device of claim 8 wherein the threshold adjustment circuit comprises:
- a plurality of resistors coupled in series between the voltage pump and a reference voltage supply; and
- a switching circuit having signal terminals coupled in parallel with at least one of the resistors and having a control terminal adapted to receive the pump-boost signal, the switching circuit coupling the signal terminals together responsive to the pump-boost signal being active and isolating the signal terminals responsive to the pump-boost signal being inactive.

13. The memory device of claim 12 wherein the switching circuit comprises an NMOS transistor.

14. The memory device of claim 12 wherein the plurality of resistors comprises a first resistor coupled between the voltage pump and the node, and second, third, and fourth resistors coupled in series between the node and the reference voltage supply.

15. The memory device of claim 14 wherein the switching circuit is coupled in parallel with the third resistor.

16. A computer system, comprising:
- a data input device;
- a data output device;
- a processor coupled to the data input and output devices; and
- a memory device coupled to the processor, the memory device comprising,
  - an address bus;
  - a control bus;
  - a data bus;
  - an address decoder coupled to the address bus;
  - a read/write circuit coupled to the data bus;
  - a control circuit coupled to the control bus;
  - a memory-cell array coupled to the address decoder, control circuit, and read/write circuit; and
  - a voltage generation circuit coupled to at least one of the address decoder and the memory-cell array, the voltage generation circuit comprising,
    - a voltage pump adapted to receive a supply voltage, the voltage pump operable to develop an output voltage responsive to a pump activation signal;
    - a threshold adjustment circuit adapted to receive a pump-boost signal and being coupled to the voltage pump and to a reference voltage supply, the threshold adjustment circuit operable develop an activation voltage on a node responsive to the output voltage from the voltage pump, the activation voltage reaching a trigger value when the output voltage has a first magnitude and the pump-boost signal is active, and the activation voltage reaching the trigger value when the output voltage has a second magnitude and the pump-boost signal is inactive:
    - a switching circuit having a first signal terminal adapted to receive a supply voltage and a second signal terminal, and having a control terminal coupled to the node, switching circuit coupling the signal terminals together responsive to the activation voltage on the node;
    - a resistor coupled between the second signal terminal the reference voltage supply; and
    - an inverter having an input coupled to the second signal terminal and having an output, the inverter developing the pump activation signal on the output responsive to a voltage across the resistor.

17. The computer system of claim 16 wherein the memory device comprises a DDR SDRAM.

18. The computer system of claim 16 wherein the first magnitude is greater than the second magnitude.

19. The computer system of claim 16 wherein the voltage pump comprises a pumped supply voltage pump and wherein the output voltage comprises a pumped supply voltage.

20. The computer system of claims 16 wherein the threshold adjustment circuit comprises:
   a plurality of resistors coupled in series between the voltage pump and a reference voltage supply; and
   a switching circuit having signal terminals coupled in parallel with at least one of the resistors and having a control terminal adapted to receive the pump-boost signal, the switching circuit coupling the signal terminals together responsive to the pump-boost signal being active and isolating the signal terminals responsive to the pump-boost signal being inactive.

21. The computer system of claim 20 wherein the switching circuit comprises an NMOS transistor.

22. The computer system of claim 20 wherein the plurality of resistors comprises a first resistor coupled between the voltage pump and the node, and second, third, and fourth resistors coupled in series between the node and the reference voltage supply.

23. The computer system of claim 20 wherein the switching circuit is coupled in parallel with the third resistor.

24. A method of controlling a voltage pump contained in an integrated circuit, the method comprising:
   detecting a command applied to the integrated circuit;
   decoding and executing the command; and
   adjusting a threshold at which the voltage pump is activated responsive to the detected command, a demand placed on the voltage pump upon the command being decoded and executed and the threshold adjusted prior to the demand being placed on the voltage pump.

25. The method of claim 24 wherein the command comprises an auto-refresh command and wherein the integrated circuit comprises a memory device.

26. A method of controlling a voltage pump contained in an integrated circuit, the method comprising:
   detecting a command applied to the integrated circuit;
   decoding and executing the command; and
   activating the voltage pump responsive to the command being detected, a demand placed on the voltage pump upon the command being decoded and executed and the voltage pump is active prior to the demand being placed on the voltage pump.

27. The method of claim 26 wherein the command comprises an auto-refresh command and wherein the integrated circuit comprises a memory device.

* * * * *